United States Patent [19]

Kotaki et al.

[11] Patent Number: 4,946,548
[45] Date of Patent: Aug. 7, 1990

[54] DRY ETCHING METHOD FOR SEMICONDUCTOR

[75] Inventors: Masahiro Kotaki; Masafumi Hashimoto, both of Nagoya, Japan

[73] Assignees: Toyoda Gosei Co., Ltd., Nishikasugai; Kabushiki Kaisha Toyota Chuo Kenkyusho, Aichi; Research Development Corporation of Japan, Tokyo, all of Japan

[21] Appl. No.: 338,855

[22] Filed: Apr. 17, 1989

[30] Foreign Application Priority Data

Apr. 29, 1988 [JP] Japan ................. 63-108666
Apr. 29, 1988 [JP] Japan ................. 63-108667

[51] Int. Cl.$^5$ ........................................ H01L 21/306
[52] U.S. Cl. ..................... 156/643; 156/646; 156/656; 156/662
[58] Field of Search ............ 156/662, 665, 646, 643, 156/664, 656

[56] References Cited

U.S. PATENT DOCUMENTS

| | | | |
|---|---|---|---|
| 3,984,301 | 10/1976 | Matsuzaki et al. | 204/192.32 |
| 4,101,411 | 7/1978 | Suzuki et al. | 204/298 |
| 4,635,343 | 1/1987 | Kuroda | 156/646 X |
| 4,640,737 | 2/1987 | Nagasaka et al. | 156/643 |

FOREIGN PATENT DOCUMENTS 53-43480  4/1978  Japan .

OTHER PUBLICATIONS

Smolinsky, Chang, Mayer: J. Vac. Technol., 18,12 (1981), "Plasma Etching of III-V Compound Semiconductor".
R. E. Klinger, J. E. Greene: J. Appl. Phys., 54,1595 (1983), "Reactive Ion Etching of GaAs in $CCl_4-xF_x(x=0,2,4)$ and Mixed $CCl_4-xF_x/Ar$ Discharges".
Jean Vatus et al.: IEEE Transactions on Electron Devices ED-33,934 (1986), "Highly Selective Reactive Ion Etching Applied to the Fabrication of Low-Noise AlGaAs GaAs FET's".
Alan Seabaugh: J. Vac. Technol., B6,77 (1988), "Selective Reactive Ion Etching of GaAs on AlGaAs Using $CCl_2F_2$ and Lie".
K. Hikosaka et al.: Jpn. J. Appl. Phys., 20,L847 (1981), "Selective Dry Etching of AlGaAs-GaAs Heterojunction".
S. Salimian et al.: Appl. Phys. Lett. 51,1083 (1987), "Reactive Ion Etch Process with Highly Controllable GaAs-to-AlGaAs Selectivity Using $SF_4$ and $SiCl_4$".
S. J. Pearton et al.: J. Appl. Phys., 65,1281 (1989), "Reactive Ion Etching of GaAs with $CCl_2F_2:O_2$:Etch Rates, Surface Chemistry and Residual Damage".

Primary Examiner—David L. Lacey
Assistant Examiner—Thi Dang
Attorney, Agent, or Firm—Cushman, Darby & Cushman

[57] ABSTRACT

A dry etching method for $Al_xGa_{1-x}N(0 \leq x \leq 1)$ semiconductor is disclosed. The method includes a first method using plasma of carbon tetrachloride ($CCl_4$) gas, and a second method using plasma of dichlorodifluoromethane ($CCl_2F_2$) gas. The etching speed of the former method was 430 Å/min. and the etching speed of the latter method was 625 Å/min. Also, no crystal defect was produced in the above-mentioned semiconductor by the above-mentioned etching.

4 Claims, 4 Drawing Sheets

DRY ETCHING METHOD FOR SEMICONDUCTOR

BACKGROUND OF THE INVENTION

The present invention relates to a dry etching method for $Al_xGa_{1-x}N(0 \leqq x \leqq 1)$ semiconductor.

Conventionally, the $Al_xGa_{1-x}N(0 \leqq x \leqq 1)$ semiconductor has been watched with keen interest as a material for light emitting diodes emitting blue light and light emitting devices emitting light of short wavelength region, and in manufacturing such devices, it is required to establish etching techniques such as mesa etching, recess etching and the like likewise the case of other compound semiconductors.

The $Al_xGa_{1-x}N$ semiconductor is a substance which is very stable chemically, and is insoluble in an acid such as hydrochloric acid, sulphuric acid, or hydrofluoric acid or a mixture thereof which is used normally as an etching fluid for other III-V group compound semiconductors. For this reason, for the etching techniques relating to the $Al_xGa_{1-x}N$ semiconductor, only the following few methods have been known.

A first method is wet etching using a solution of caustic soda, caustic potash or potassium pyrosulfate which is heated to 800° C. or more. Also, a second method is electrolytic jet etching using 0.1N solution of caustic soda Then, a third method is wet etching using a mixture of phosphoric acid and sulfuric acid with a mixing ratio of 1:2 -1:5 at temperatures of 180° C.-250° C.

However, the above-mentioned first and second methods find a difficulty in practical use because of using a high-temperature corrosive substance. Also, the third method has a problem that the etching speed is varied greatly by a slight change in temperature. Thus, none of the above-mentioned methods has been brought into practical use.

Also, all of the above-mentioned methods employ wet etching, and therefore deficiencies peculiar to wet etching such as an occurrence of under cut cannot be eliminated.

On the other hand, for the dry etching method relating to the $Al_xGa_{1-x}N$ semiconductor, there is no known method at all. Prediction of selecting a gas having a desirable reaction characteristic in plasma etching is impossible because the reaction mechanism is affected by the combination and the crystalline structure of atoms of a compound semiconductor to be etched. Accordingly, prediction cannot be made on whether or not an existing reaction gas is effective for etching the $Al_xGa_{1-x}N$ semiconductor.

SUMMARY OF THE INVENTION

Accordingly, an object of the present invention is to provide a dry etching method for the $Al_xGa_{1-x}N$ semiconductor.

Also, another object of the present invention is to facilitate manufacture of light emitting diodes emitting blue light by establishing the dry etching method for the $Al_xGa_{1-x}N$ semiconductor.

Then the present inventors have zealously carried out experimental studies on the etching speed, the kind of reaction gases to be used and other conditions in plasma etching of the $Al_xGa_{1-x}N$ semiconductor, and resultingly have found the following fact.

The $Al_xGa_{1-x}N(0 \leqq x \leqq 1)$ semiconductor is nicely etched by plasma of carbon tetrachloride ($CCl_4$) gas or plasma of dichlorodifluoromethane ($CCl_2F_2$) gas.

The above-mentioned plasma etching is performed normally by employing a parallel-electrode-type apparatus wherein electrodes whereto high-frequency power is applied are disposed in parallel and objects to be etched are disposed on the electrode, a cylindrical-electrode-type apparatus wherein electrodes whereto high-frequency power is applied are disposed cylindrically and objects to be etched are disposed in parallel to the cross-section of the cylinder or an apparatus of other configuration. Also, the plasma state of carbon tetrachloride ($CCl_4$) gas or dichlorodifluoromethane ($CCl_2F_2$) gas is generated by applying high-frequency power between the electrodes in the above-mentioned parallel-electrode-type apparatus or cylindrical-electrode-type apparatus.

DESCRIPTION OF THE INVENTION

Hereinafter, description is made on the present invention based on a specific embodiment.

Figures 2, 3, 4, 5:
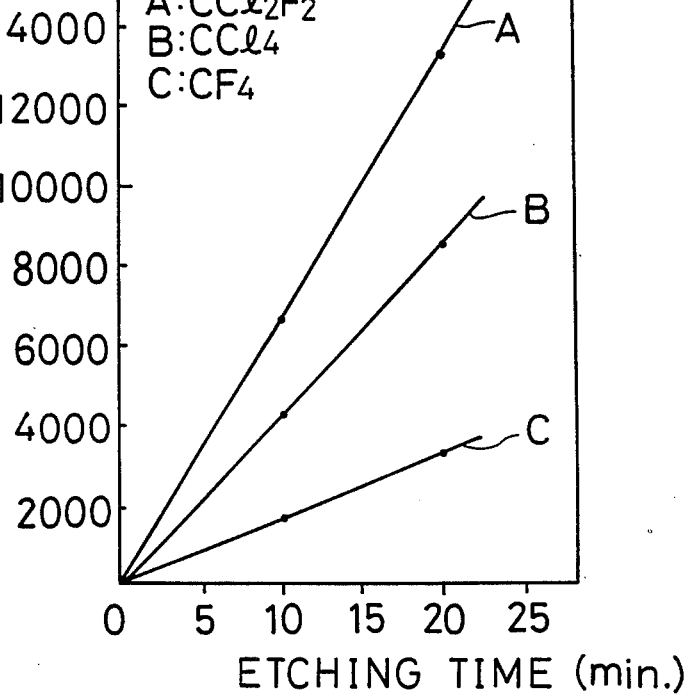
FIG. 2 is a cross-sectional view showing a configuration of a sample to be etched.
FIG. 3 is a cross-sectional view showing a relationship between the sample to be etched and a mask.
FIG. 4 is a cross-sectional view of the sample after etching.
FIG. 5 is a graph showing measured values of the etching speed.

Semiconductors used in a method of this embodiment were fabricated in a structure as shown in FIG. 2 by the metalorganic vapor phase epitaxy method (hereinafter referred to as MOVPE).

Gases used in this method are $NH_3$ and carrier gas $H_2$ and trimethylgallium ($Ga(CH_3)_3$) (hereinafter referred to as "TMG") and trimethylaluminum ($Al(CH_3)_3$) (hereinafter referred to as "TMA").

First, a single-crystal sapphire substrate 1 whose main plane is the C {0001} plane cleaned by organic cleaning and heat treatment was attached to a susceptor placed in a reaction chamber of a MOVPE apparatus. Next, the pressure in the reaction chamber was reduced to 5 Torr, and the sapphire substrate 1 was vapor-etched at a temperature of 1100° C. in H gas flowing into the reaction chamber at a flow rate of 0.3l/min.

Subsequently, the temperature was reduced to 800° C., and heat treatment was applied for one minute while supplied with $H_2$ at a flow rate of 3l/min., $NH_3$ at a flow rate of 2l/min. and TMA at a flow rate of $7 \times 10^{-6}$mol /min. An AlN buffer layer 2 was formed in a thickness of about 500Å by this heat treatment.

Next, after a lapse of one minute, the supply of TMA was stopped, and the temperature of the sapphire substrate 1 was kept at 1000° C., and $H_2$ at a rate of 2.5l/min., $NH_3$ at a rate of 1.5l/min. and TMG at a rate of $1.7 \times 10^{-6}$ mol/min. were supplied 5 for 60 minutes, and thereby a GaN layer 3 of about 3μm in film thickness was formed.

Figure 1:
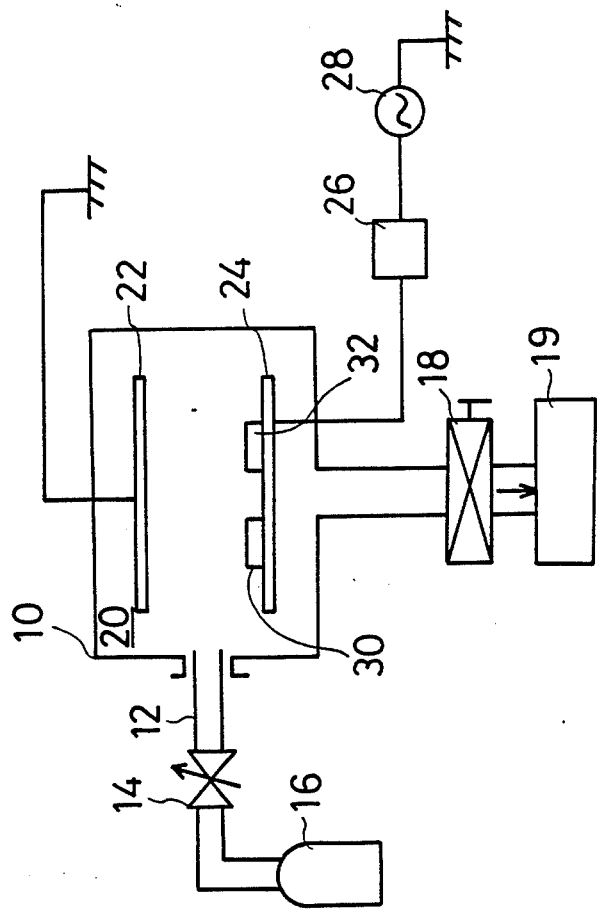
FIG. 1 is a configuration view showing an apparatus for realizing an etching method of one specific embodiment in accordance with the present invention.

Next, a mask 4 composed of sapphire was placed on the top surface of the GaN layer 3 thus formed as shown in FIG. 3 to make a sample 30, and the exposed GaN layer 3 was etched by a plasma etching apparatus of parallel flat plate electrodes type as shown in FIG. 1.

In the parallel-electrode-type (electrode) apparatus as shown in FIG. 1, an introducing pipe 12 introducing an etching gas is installed on the side wall of a stainless steel vacuum vessel 10 forming a reaction chamber 20, and the introducing tube 12 is connected to a tank 16 storing $CCl_4$ gas through a mass flow controller 14 capable of varying the gas flow rate. Then, $CCl_4$ gas is introduced into the reaction chamber 20 from the tank 16 through the mass flow controller 14.

Also, the reaction chamber 20 is exhausted by a diffusion pump 19, and the degree of vacuum of the reaction chamber 20 is adjusted by a conductance valve 18 installed between the reaction chamber 20 and the diffusion pump 19.

On the other hand, an electrode 22 and an electrode 24 which are insulated from the vacuum vessel 10 by fluoric resin are disposed in the reaction chamber 10 in a manner of facing each other in the up-down direction. Then, the electrode 22 is grounded, and the electrode 24 is supplied with high-frequency power. The high-frequency power is supplied from a high-frequency power source 28 of a frequency of 13.56 MHz through a matching unit 26.

Also, samples 30 and 32 having a configuration as shown in FIG. 3 is put on the electrode 24.

Where plasma etching is performed in the apparatus having such a configuration, first the samples 30 and 32 are put on the electrode 24, and thereafter residual gas in the reaction chamber 20 is fully exhausted by the diffusion pump 19, and the degree of vacuum of the reaction chamber 20 is reduced to $5 \times 10^{-6}$ Torr. Thereafter, $CCl_4$ gas was introduced into the reaction chamber 20 while controlled at a flow rate of 10cc/min. by the mass flow controller 14, and the degree of vacuum of the reaction chamber 20 was adjusted accurately to 0.04 Torr by the conductance valve 18. Then, when high-frequency power of 200W (0.4W/cm$^2$) was supplied, glow discharge was started between the electrodes, and the introduced $CCl_4$ gas was put in the plasma state, and etching of the samples 30 and 32 was started.

As a result of etching for a predetermined time, the sample 30 was etched in a structure as shown in FIG. 4. This means that the portion of the GaN layer 3 covered with the mask 4 is not etched, and only the exposed GaN layer 3 was etched in a shape as illustrated.

Etching was performed likewise by varying the etching time, and a step difference Δ produced by etching was measured using a step difference meter, and a relationship to the etching time was measured. A straight line B in FIG. 5 shows the result thereof. From the result of the measurement, the etching speed was 430Å/min.

For the purpose of comparison, etching was performed under similar conditions by changing the etching gas to $CF_4$, and the etching speed was measured, and resultingly a characteristic as shown by a straight line C in FIG. 5 was obtained, and the etching speed by $CF_4$ gas was 170Å/min.

Accordingly, it was found that the etching speed of the dry etching using $CCl_4$ gas is about 2.5 times that of the case with $CF_4$.

Figure 6:
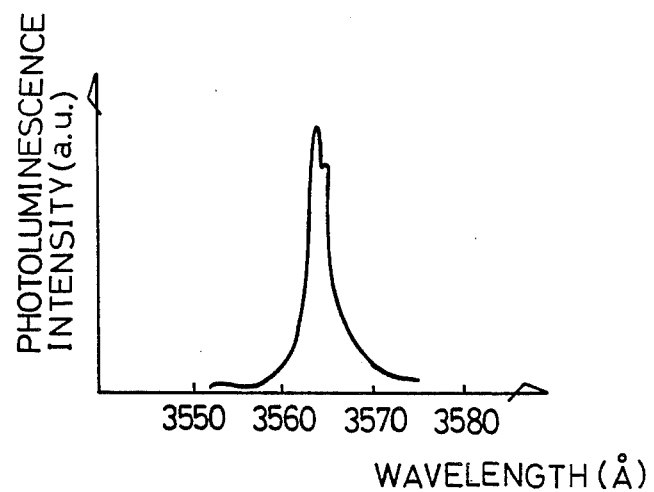
FIG. 6 is a graph showing a photoluminescence spectrum of the sample before etching.
Figure 7:
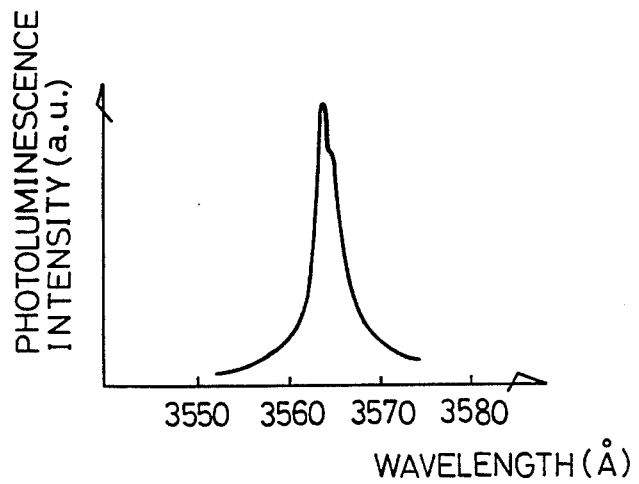
FIG. 7 is a graph showing a photoluminescence spectrum of the sample after etching by carbon tetrachloride ($CCl_4$) gas.

Also, the samples were cooled to 4.2K before and after the above-mentioned etching, and the intensity of photoluminescence was measured by irradiating helium cadmium laser with a wavelength of 3250Å. FIG. 6 and FIG. 7 show the result thereof. FIG. 6 shows a photoluminescence spectrum before etching, and FIG. 7 shows a photoluminescence spectrum after etching. No change was found in the peak intensity, the peak wavelength and the half value width in the photoluminescence spectra.

This revealed that the crystalline property of the GaN layer 3 is not changed by the above-mentioned etching.

Also, it was found that the under AlN layer is etched by sufficiently performing this etching, and this is applicable also to etching of $Al_xGa_{1-x}N$.

In addition, in the above-mentioned embodiment, the substrate whose main plane is the C plane was used, but a substrate whose main plane is oriented to another crystal direction can also be used without limiting to this substrate.

Next, description is made on another embodiment.

The manufacturing method and structure of the samples 30 and 32 are the same as the case of the above-described first embodiment. Also, the apparatus in FIG. 1 was used also for the etching apparatus, and only difference is that the reaction gas is $CCl_2F_2$ gas. This means that $CCl_2F_2$ gas is stored in the tank 16, and this $CCl_2F_2$ gas is introduced into the reaction chamber 20 through the mass flow controller 14.

Furthermore, the other etching processes and etching conditions are quite the same as those of the first embodiment. This means that etching was performed by the following processes and conditions. The samples 30 and 32 are placed on the electrode 24, and thereafter residual gas in the reaction chamber 20 is exhausted sufficiently by the diffusion pump 19, and the degree of vacuum of the reaction chamber 20 is reduced to $5 \times 10^{-6}$ Torr. Thereafter, $CCl_2F_2$ gas is introduced into the reaction chamber 20 while controlled at a flow rate of 10cc/min. by the mass flow controller 14, and the degree of vacuum of the reaction chamber 20 is adjusted accurately to 0.04 Torr by the conductance valve 18. Then, when high-frequency power of 200W (0.4W/cm$^2$) is supplied between the electrode 24 and the electrode 22, glow discharge is started between the electrodes, and the introduced $CCl_2F_2$ gas is put in the plasma state, and etching of the samples 30 and 32 is started.

As a result of etching for a predetermined time, the sample 30 was etched in a structure as shown in FIG. 4. This means that the portion of the GaN layer 3 covered with the mask 4 was not etched, and only the exposed GaN layer 3 was etched in a shape as illustrated.

Etching was performed likewise by varying the etching time, and the step difference Δ produced by etching was measured using the step difference meter and a relationship to the etching time was obtained The result thereof is shown by a straight line A in FIG. 5.

The result of the measurement revealed that the etching speed is 625Å/min.

Accordingly, it was found that the etching speed of the dry etching using $CCl_2F_2$ gas is about 1.5 times that of the case with $CCl_4$ gas and about 3.7 times that of the case with $CF_4$ gas.

Figure 8:
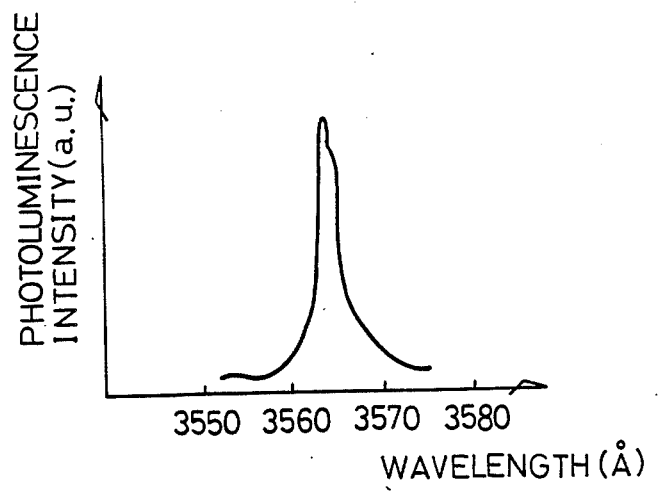
FIG. 8 is a graph showing a photoluminescence spectrum of another sample before etching.
Figure 9:
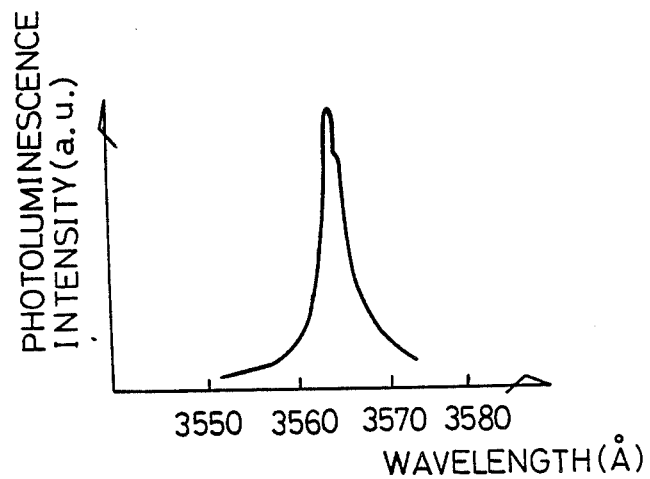
FIG. 9 is a graph showing a photoluminescence spectrum of the same sample after etching by dichlorodifluoromethane ($CCl_2F_2$) gas.

Also, the samples were cooled to 4.2K before and after the above-mentioned etching, and the intensity of photoluminescence was measured likewise the case of the first embodiment by irradiating helium cadmium laser with a wavelength of 3250Å, and the measurement resulted in characteristics as shown in FIG. 8 and FIG. 9. FIG. 8 shows a photoluminescence spectrum before etching and FIG. 9 shows a photoluminescence spectra after etching.

In those photoluminescence spectra, like the first embodiment, no change was found in the peak intensity, the peak wavelength and the half value width. This revealed that the crystalline property of the GaN layer 3 is not changed by the above-mentioned etching Also, it was found that the under AlN layer is etched by sufficiently performing this etching, and this is applicable also to etching of $Al_xGa_{1-x}N$.

Also, in the etching by carbon tetrachloride ($CCl_4$) gas etching was performed nicely in ranges of 5–30cc/min. of flow rate, 0.02–0.2 Torr of vacuum degree, and 0.1–0.5W/cm$^2$ of high-frequency power, and in the etching by dichlorodifluoromethane ($CCl_2F_2$) gas, etching was performed nicely in ranges of 5–30cc/min of flow rate, 0.02–0.1 Torr of vacuum degree, and 0.1–0.5W/cm$^2$ of high-frequency power. As mentioned above, the $Al_xGa_{1-x}N(0 \leq x \leq 1)$ semiconductor was able to be etched efficiently without producing any crystal defect by plasma of carbon tetrachloride ($CCl_4$) gas or dichlorodifluoromethane ($CCl_2F_2$) gas.

Accordingly, in manufacturing devices, IC and the like using the $Al_xGa_{1-x}N(0 \leq x \leq 1)$ semiconductor, by employing the present invention, the productivity thereof can be greatly improved.

What is claimed is:

1. A dry etching method for $Al_xGa_{1-x}N(0 \leq X \leq 1)$ semiconductors comprising:
   introducing carbon tetrachloride ($CCl_4$) etching gas into a reaction chamber under vacuum;
   applying high-frequency power to produce plasma of said carbon tetrachloride gas; and
   etching said $Al_xGa_{1-x}N(O \leq x \leq 1)$ semiconductor with said plasma.

2. A dry etching method in accordance with claim 1, wherein the flow rate of said etching gas is 5–30cc/min., the degree of vacuum is 0.02–0.2 Torr and said high-frequency power is 0.1–0.5W/cm$^2$.

3. A dry etching method for $Al_xGa_{1-x}N(0 \leq X \leq 1)$ semiconductors comprising;
   introducing dichlorodifluoromethane ($CCl_2F_2$) etching gas into a reaction chamber under vacuum;
   applying high-frequency power to produce plasma of said dichlorodifluoromethane gas; and
   etching said $Al_xGa_{1-x}N(0 \leq x \leq 1)$ semiconductor with said plasma.

4. A dry etching method in accordance with claim 3, wherein the flow rate of said etching gas is 5–30cc/min., the degree of vacuum is 0.02–0.1 Torr, and said high-frequency power is 0.1–0.5W/cm$^2$.

* * * * *